United States Patent
Cheng et al.

(10) Patent No.: US 10,886,284 B2
(45) Date of Patent: Jan. 5, 2021

(54) ANTI-FUSE WITH REDUCED PROGRAMMING VOLTAGE

(71) Applicant: INTERNATIONAL BUSINESS MACHINES CORPORATION, Armonk, NY (US)

(72) Inventors: Kangguo Cheng, Schenectady, NY (US); Juntao Li, Cohoes, NY (US); Chengwen Pei, Danbury, CT (US); Geng Wang, Stormville, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 16/689,373

(22) Filed: Nov. 20, 2019

(65) Prior Publication Data

US 2020/0091161 A1    Mar. 19, 2020

Related U.S. Application Data

(60) Continuation of application No. 16/120,794, filed on Sep. 4, 2018, now Pat. No. 10,586,800, which is a (Continued)

(51) Int. Cl.
*H01L 27/112* (2006.01)
*H01L 23/525* (2006.01)
(Continued)

(52) U.S. Cl.
CPC ........ *H01L 27/11206* (2013.01); *H01L 21/84* (2013.01); *H01L 23/5252* (2013.01); *H01L 29/0653* (2013.01); *H01L 29/1054* (2013.01); *H01L 29/161* (2013.01); *H01L 29/165* (2013.01); *H01L 29/66628* (2013.01); (Continued)

(58) Field of Classification Search
CPC .......... H01L 27/11206; H01L 27/0629; H01L 27/101; H01L 27/112; H01L 21/02532; H01L 21/02664; H01L 21/26506; H01L 21/84; H01L 29/1054; H01L 29/76;
(Continued)

(56) References Cited

U.S. PATENT DOCUMENTS 5,774,011 A   6/1998  Au et al.
6,096,580 A   8/2000  Iyer et al.
(Continued)

OTHER PUBLICATIONS

List of IBM Patents or Patent Applications Treated as Related dated Nov. 20, 2019, 2 pages.

*Primary Examiner* — Mouloucoulaye Inoussa
(74) *Attorney, Agent, or Firm* — Tutunjian & Bitetto, P.C.; Kevin Michael Jordan (57) ABSTRACT

A semiconductor device having transistors and anti-fuses integrated thereon includes a transistor region having a defect free monocrystalline semiconductor layer and a device channel for a transistor. The device also has an anti-fuse region including a defective semiconductor layer formed on an oxide of a portion of the surface of an epitaxial semiconductor layer over which the transistor is formed, the oxide having a thickness extending into the epitaxial semiconductor layer. It also has gate structures formed in the transistor region and in the anti-fuse region, where the defective semiconductor layer is programmable by an applied field on the gate structures in the anti-fuse region.

20 Claims, 4 Drawing Sheets

Related U.S. Application Data continuation of application No. 15/694,170, filed on Sep. 1, 2017, now Pat. No. 10,224,334, which is a division of application No. 15/174,200, filed on Jun. 6, 2016, now Pat. No. 9,806,084.

(51) Int. Cl.

| | |
|---|---|
| *H01L 29/161* | (2006.01) |
| *H01L 29/165* | (2006.01) |
| *H01L 29/78* | (2006.01) |
| *H01L 29/06* | (2006.01) |
| *H01L 29/66* | (2006.01) |
| *H01L 21/84* | (2006.01) |
| *H01L 29/10* | (2006.01) |

(52) U.S. Cl.
CPC ...... *H01L 29/7848* (2013.01); *H01L 29/7849* (2013.01); *H01L 29/7851* (2013.01); *H01L 21/845* (2013.01); *H01L 2924/14* (2013.01); *H01L 2924/15787* (2013.01)

(58) Field of Classification Search
CPC ....... H01L 21/82; H01L 21/44; G11C 17/165; G11C 17/16; G11C 17/18
USPC ......... 257/529, 530, E27.102, E27.103, 390, 257/209, 202; 438/479, 480, 481–482, 438/486, 507, 5, 131, 600
See application file for complete search history.

(56) References Cited

U.S. PATENT DOCUMENTS

| | | |
|---|---|---|
| 6,580,145 B2 | 6/2003 | Wu et al. |
| 7,087,499 B2 | 8/2006 | Rankin et al. |
| 7,402,855 B2 | 7/2008 | Kurjanowicz |
| 7,456,436 B2 | 11/2008 | Chang et al. |
| 7,982,245 B2 | 7/2011 | Lim et al. |
| 8,049,299 B2 | 11/2011 | Min et al. |
| 8,742,457 B2 | 6/2014 | Yang |
| 8,891,328 B2 | 11/2014 | Li |
| 9,058,999 B2 | 6/2015 | Li |
| 9,177,963 B2 | 11/2015 | Mittal et al. |
| 2006/0292770 A1* | 12/2006 | Wu .......................... H01L 21/84 438/187 |
| 2014/0124864 A1 | 5/2014 | Hong |
| 2015/0348979 A1 | 12/2015 | Nygaard |
| 2017/0186756 A1 | 6/2017 | Choi |

\* cited by examiner

ANTI-FUSE WITH REDUCED PROGRAMMING VOLTAGE

BACKGROUND

Technical Field

The present invention generally relates to semiconductor devices and processing, and more particularly to anti-fuse structures integrated into transistor device fabrication processes.

Description of the Related Art

Anti-fuses are commonly employed in the semiconductor industry. Anti-fuses are activated to create a connection between two or more conductors. In one example, anti-fuses may be employed for one-time programming purposes. The anti-fuse can be used to repair DRAM arrays by swapping defective cells with redundant cells and can also be used in product configuration, for updating and repairing devices.

Anti-fuses often require special processing for integration on chips. With supply and threshold voltages scaling down and device dimensions shrinking, this becomes increasingly challenging.

SUMMARY

A semiconductor device having transistors and anti-fuses integrated thereon includes a transistor region having a defect free monocrystalline semiconductor layer and a device channel for a transistor. The device also has an anti-fuse region including a defective semiconductor layer formed on an oxide of a portion of the surface of an epitaxial semiconductor layer over which the transistor is formed, the oxide having a thickness extending into the epitaxial semiconductor layer. It also has gate structures formed in the transistor region and in the anti-fuse region, where the defective semiconductor layer is programmable by an applied field on the gate structures in the anti-fuse region.

A semiconductor device having transistors and anti-fuses integrated thereon includes a transistor region including a defect free monocrystalline strained semiconductor material formed over a semiconductor layer to form a device channel for a transistor. The device also has an anti-fuse region including an oxidized surface of the semiconductor layer in the anti-fuse region forming an oxide layer having a thickness extending into the semiconductor layer in the anti-fuse region. The semiconductor device further includes a defective semiconductor layer epitaxially grown on the oxidized surface in the anti-fuse region as well as gate structures formed in the transistor region and in the anti-fuse region, where the defective semiconductor layer is programmable by an applied field on the gate structures in the anti-fuse region.

A method for integrating transistors and anti-fuses on a device includes epitaxially growing a semiconductor layer on a substrate, and forming an oxide on an anti-fuse region of the semiconductor layer. The method also includes growing a semiconductor material over the semiconductor layer to form an epitaxial semiconductor layer in a transistor region and a defective semiconductor layer in the anti-fuse region, and forming transistor devices in the transistor region and anti-fuse devices in the anti-fuse region such that the defective semiconductor layer is programmable by an applied field.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

In accordance with the present principles, devices and methods are provided to integrate transistors (e.g., field effect transistors (FETs)) with anti-fuses on a same chip. In one embodiment, the anti-fuses are formed on a defective semiconductor layer while the transistors are formed on a defect-free strained semiconductor layer. Defects in the defective semiconductor layer reduce dielectric breakdown voltage. In this way, a defective semiconductor channel formed with the defective semiconductor layer reduces the programming voltages needed to program the anti-fuse. The anti-fuses are preferably provided with a low programming voltage that employs gate activation to program the anti-fuses.

An anti-fuse is an electrical device that performs the opposite function to a fuse. A fuse breaks an electrically conductive path, and an anti-fuse creates an electrically conductive path. Anti-fuses may be employed to permanently program integrated circuits (ICs). Certain programmable logic devices (PLDs), such as structured application specific ICs (ASICs), use anti-fuse technology to configure logic circuits and create a customized design from a standard IC design. Anti-fuse PLDs are usually a one-time programmable device that does not need to be configured each time power is applied.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements may be included in the compound and still function in accordance with the present principles. The compounds with additional elements will be referred to herein as alloys.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, may be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein may be interpreted accordingly. In addition, it will also be understood that when a layer is referred to as being "between" two layers, it can be the only layer between the two layers, or one or more intervening layers may also be present.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present concept.

Figure 1:
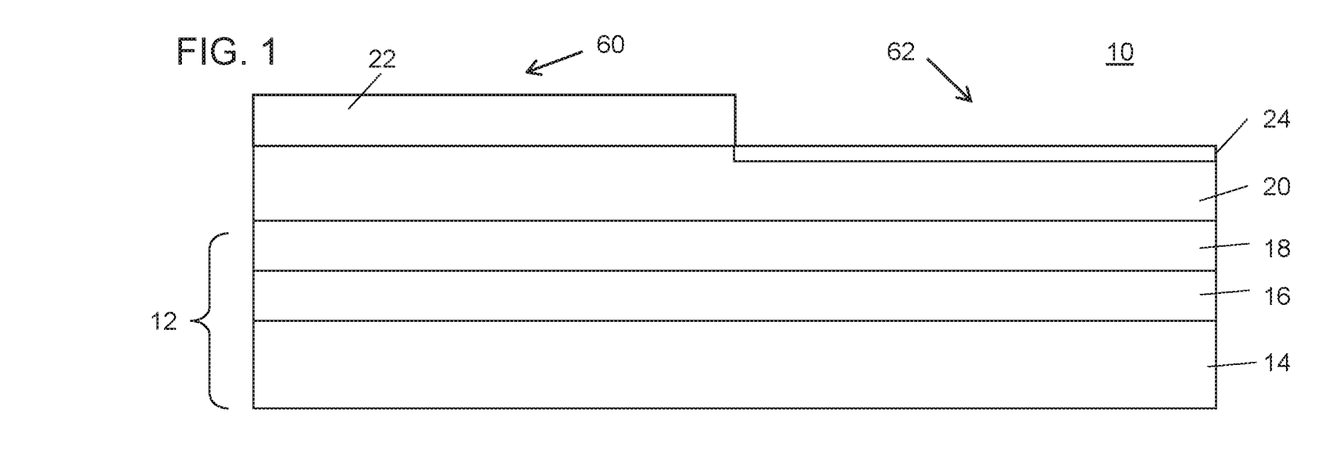
FIG. 1 is a cross-sectional view showing a device having a pad dielectric layer formed in a transistor region and an oxide grown in an anti-fuse region in accordance with the present principles.

Referring now to the drawings in which like numerals represent the same or similar elements and initially to FIG. 1, a device 10 includes a substrate 12 for integrating transistor devices and anti-fuses in accordance with the present principles. The substrate 12 may include a bulk semiconductor, a semiconductor-on-insulator (SOI), an extremely thin SOI (ETSOI), partially depleted SOI (PD-SOI), or any other suitable substrate.

In one embodiment, a SOI substrate 12 may be employed having a semiconducting material 18 including, but not limited to Si, strained Si, SiC, SiGe, SiGeC, Si alloys, Ge, Ge alloys, GaAs, InAs, and InP, or any combination thereof. The semiconducting material 18 may be thinned to a desired thickness by planarization, grinding, wet etch, dry etch, oxidation followed by oxide etch, or any combination thereof to create an ETSOI. One method of thinning the semiconducting material 18 is to oxidize by a thermal dry or wet oxidation process, and then wet etch the oxide layer using a hydrofluoric acid mixture. This process can be repeated to achieve the desired thickness. A base substrate 14 may include a semiconducting material including, but not limited to Si, strained Si, SiC, SiGe, SiGeC, Si alloys, Ge, Ge alloys, GaAs, InAs, InP as well as other III/V and II/VI compound semiconductors. A buried dielectric layer 16 may be disposed between the base 14 and the semiconducting material 18. The buried dielectric layer 16 may include a silicon oxide or other suitable dielectric material.

An epitaxial layer 20 is grown on the semiconductor material 18. In one embodiment, the epitaxial layer 20 may include SiGe if the semiconductor layer 18 includes Si.

Epitaxial growth can be performed by ultrahigh vacuum chemical vapor deposition (UHVCVD), rapid thermal chemical vapor deposition (RTCVD), metalorganic chemical vapor deposition (MOCVD), low-pressure chemical vapor deposition (LPCVD), limited reaction processing CVD (LRPCVD), molecular beam epitaxy (MBE), etc. Epitaxial materials may be grown from gaseous or liquid precursors. Epitaxial materials may be grown using vapor-phase epitaxy (VPE), molecular-beam epitaxy (MBE), liquid-phase epitaxy (LPE), or other suitable process. Epitaxial silicon, silicon germanium (SiGe), and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor. When SiGe is epitaxially grown, the SiGe may have germanium content in the range of 5% to 80%, or preferably between 20% and 60%.

The terms "epitaxial growth and/or deposition" and "epitaxially formed and/or grown," mean the growth of a semiconductor material (crystalline material) on a deposition surface of another semiconductor material (crystalline material), in which the semiconductor material being grown (crystalline over layer) has substantially the same crystalline characteristics as the semiconductor material of the deposition surface (seed material). In an epitaxial deposition process, the chemical reactants provided by the source gases are controlled, and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surface, and generally do not deposit material on exposed surfaces, such as silicon dioxide or silicon nitride surfaces.

A pad dielectric layer 22 is deposited by, e.g., a chemical vapor deposition (CVD) and is patterned using lithography or other patterning process. The pad dielectric layer 22 may include a dielectric material such as, e.g., a silicon nitride or other suitable material. The patterning of the pad dielectric layer 22 defines a region 60 where transistors will be formed and a region 62 where anti-fuses will be formed. The pad dielectric layer 22 acts as a hardmask to cover the region 60 for FET devices.

In accordance with the pad dielectric layer 22, the epitaxially grown layer 20 is modified. In one embodiment, the modification includes an oxidation of the layer 20. For example, if layer 20 includes SiGe a thin oxide layer 24 is formed on an exposed SiGe region (62) of layer 20.

Figure 2:
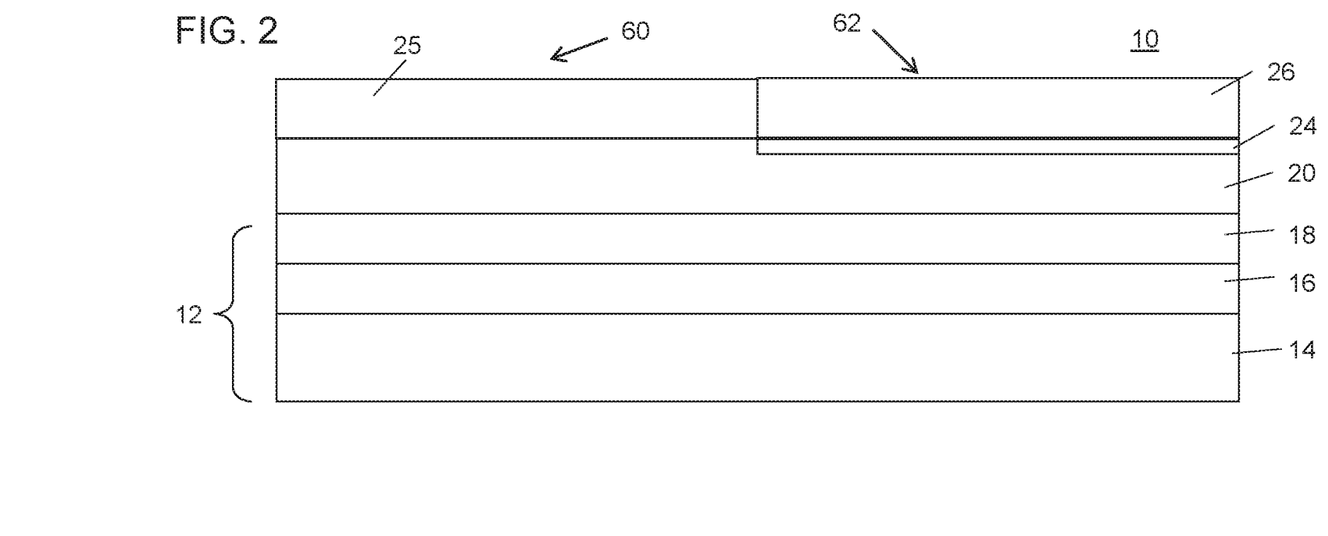
FIG. 2 is a cross-sectional view showing the device of FIG. 1 having the pad dielectric layer removed, a semiconductor material formed as a crystalline semiconductor layer in the transistor region and a defective semiconductor layer formed in the anti-fuse region in accordance with the present principles.

Referring to FIG. 2, the pad dielectric layer 22 is stripped off the layer 20. The strip may include a selective wet or dry etch. An epitaxial growth process is performed over the device 10. In region 60, the epitaxial growth process results in the formation of a monocrystalline (defect free) layer 25, while in the region 62, the epitaxial process grows a defective semiconductor layer 26 due to the oxide layer 24. In one embodiment, the layer 25 includes Si in region 60, and the Si may be strained if the underlying layer 24 is, e.g., SiGe. In region 62, the defective semiconductor layer 26 may include defective Si. In this way, strained Si 25 is formed in actual device region 60, while defective Si 26 is formed in the anti-fuse device region 62.

Defects in the anti-fuse device region 62 include dislocations, stacking faults, grain boundaries, etc. Defect density ranges from $1 \times 10^6$ to $1 \times 10^{12}/cm^2$. The defective layer can be doped or undoped. The thickness of the defective layer 26 may be substantially the same, thicker, or thinner than the strained Si 25. The thickness of the defective layer 26 may range from about 3 nm to about 20 nm, and more preferably between about 5 to about 10 nm. The defects in the defective layer 26 will reduce the breakdown voltage of the gate dielectric in the anti-fuse devices.

Figure 3:
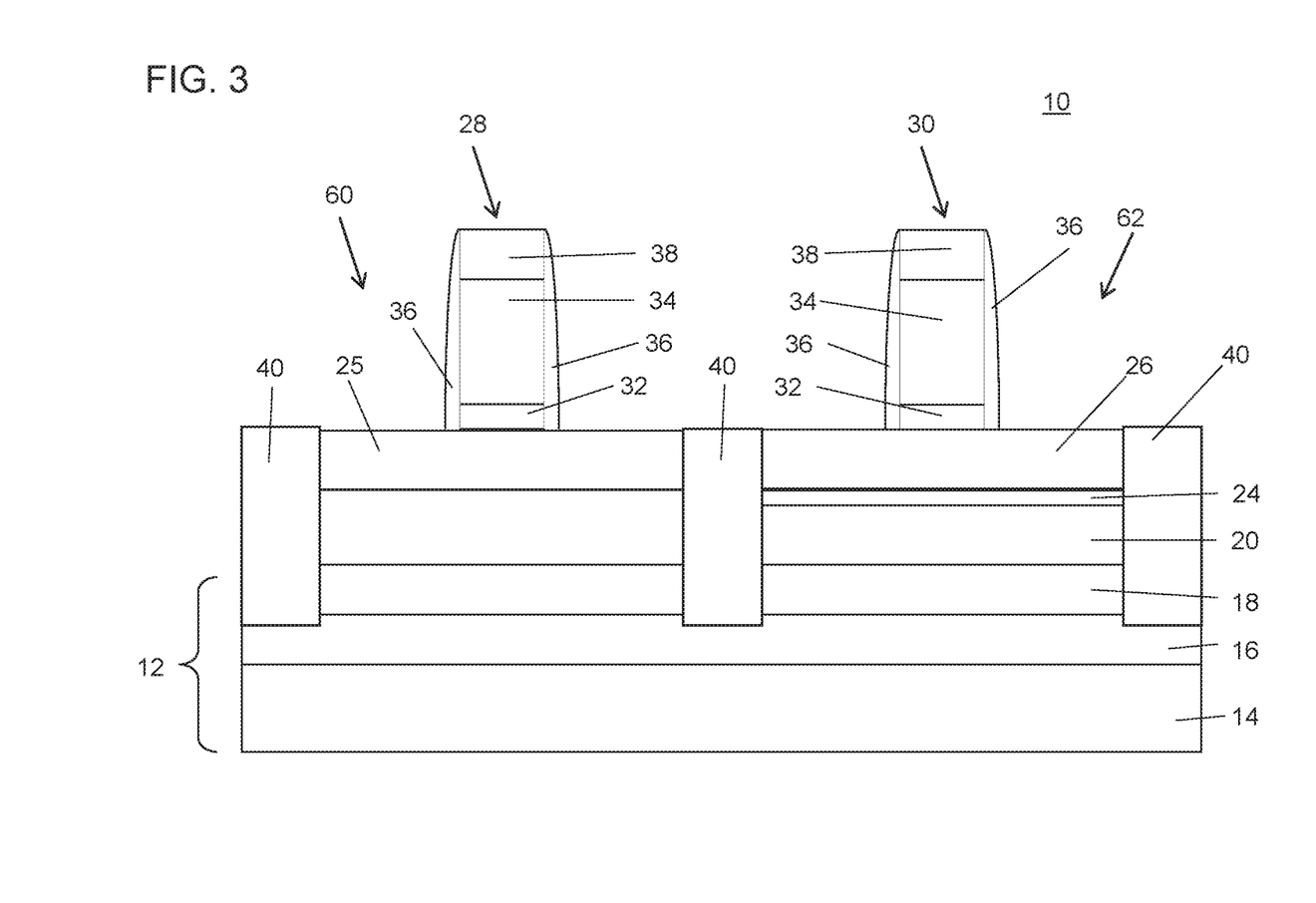
FIG. 3 is a cross-sectional view showing the device of FIG. 2 showing gate structures concurrently formed in the transistor region and the anti-fuse region in accordance with the present principles.

Referring to FIG. 3, shallow trench isolation (STI) regions 40 are formed between regions and/or devices. The STI regions are formed by etching a trench into the semiconductor material 18 (or substrate) utilizing a conventional dry etching process such as reactive-ion etching (RIE) or plasma etching. The trenches may optionally be lined with a conventional liner material, e.g., an oxide, and then CVD or another like deposition process is employed to fill the trench with polysilicon or another like STI dielectric material (oxide). The STI dielectric may optionally be densified after deposition. A conventional planarization process such as chemical-mechanical polishing (CMP) may optionally be used to provide a planar structure.

Gate structures 28, 30 are respectively formed in regions 60 and 62. The gate structures 28, 30 are respectively formed directly on the strained semiconductor layer 25 and the defective semiconductor 26, in accordance with one embodiment. The gate structures 28, 30 can be formed using deposition, photolithography and a selective etching process. Specifically, a pattern is produced by applying a photoresist to the surface to be etched. The photoresist is exposed to a pattern of radiation; and then the pattern is developed into the photoresist utilizing a resist developer. Once the patterning of the photoresist is completed, sections covered by the photoresist are protected while the exposed regions are removed using a selective etching process that removes the unprotected regions. In one embodiment, a hard mask (hereafter referred to as a dielectric cap 38) may be employed to form the gate structures 28, 30. The dielectric cap 38 may be formed by first depositing a dielectric hard mask material, like SiN or $SiO_2$, atop a layer of gate electrode material (or gate conductor) 34 and then applying a photoresist pattern to the hard mask material using a lithography process steps. The photoresist pattern is then transferred into the hard mask material using a dry etch process forming the dielectric cap 38.

Next, the photoresist pattern is removed and the dielectric cap 38 pattern is then transferred into the gate electrode material 34 during a selective etching process. The gate structures 28, 30 may include at least a gate conductor 34 atop a gate dielectric 32. Gate conductor 34 may be a metal gate electrode. The metal gate electrode 34 may be any conductive metal including, but not limited to W, Ni, Ti, Mo, Ta, Cu, Pt, Ag, Au, Ru, Ir, Rh, and Re, and alloys that include at least one of these conductive elemental metals. The gate structures 28, 30 may further include additional conductive material as the metal gate electrode 34 or as part of the gate electrode 34. In one example, a second conductive material may be a doped semiconductor material, such as a doped silicon containing material, e.g., doped polysilicon. When a combination of conductive elements is employed, an optional diffusion barrier material such as TaN or WN may be formed between the conductive materials.

The gate conductor 34 of the gate structures is formed over the gate dielectric 32. The gate dielectric 32 may be a dielectric material, such as $SiO_2$, or alternatively high-k dielectrics, such as oxides of Ta, Zr, Al, Hf or combinations thereof. The gate dielectric 32 may include, e.g., $SiO_2$, $ZrO_2$, $Ta_2O_5$ and/or $Al_2O_3$.

Dielectric spacers 36 are formed over the gates structures 28, 30 on sidewalls thereof. The dielectric spacers 36 may be formed by using a conformal blanket layer deposition, such as chemical vapor deposition, and an anisotropic etch back. The dielectric spacers 36 may be composed of a dielectric, such as a nitride, oxide, oxynitride, or a combination thereof.

It should be understood that the gate structures 28, 30 may be formed as real gates, as in the case of a gate-first method or may be formed as a dummy gate in the case of gate-last method. A replacement metal gate (RMG) FinFET can be fabricated on strained Si 25 in region 60 and on the defective Si 26 in region 62.

Figure 4:
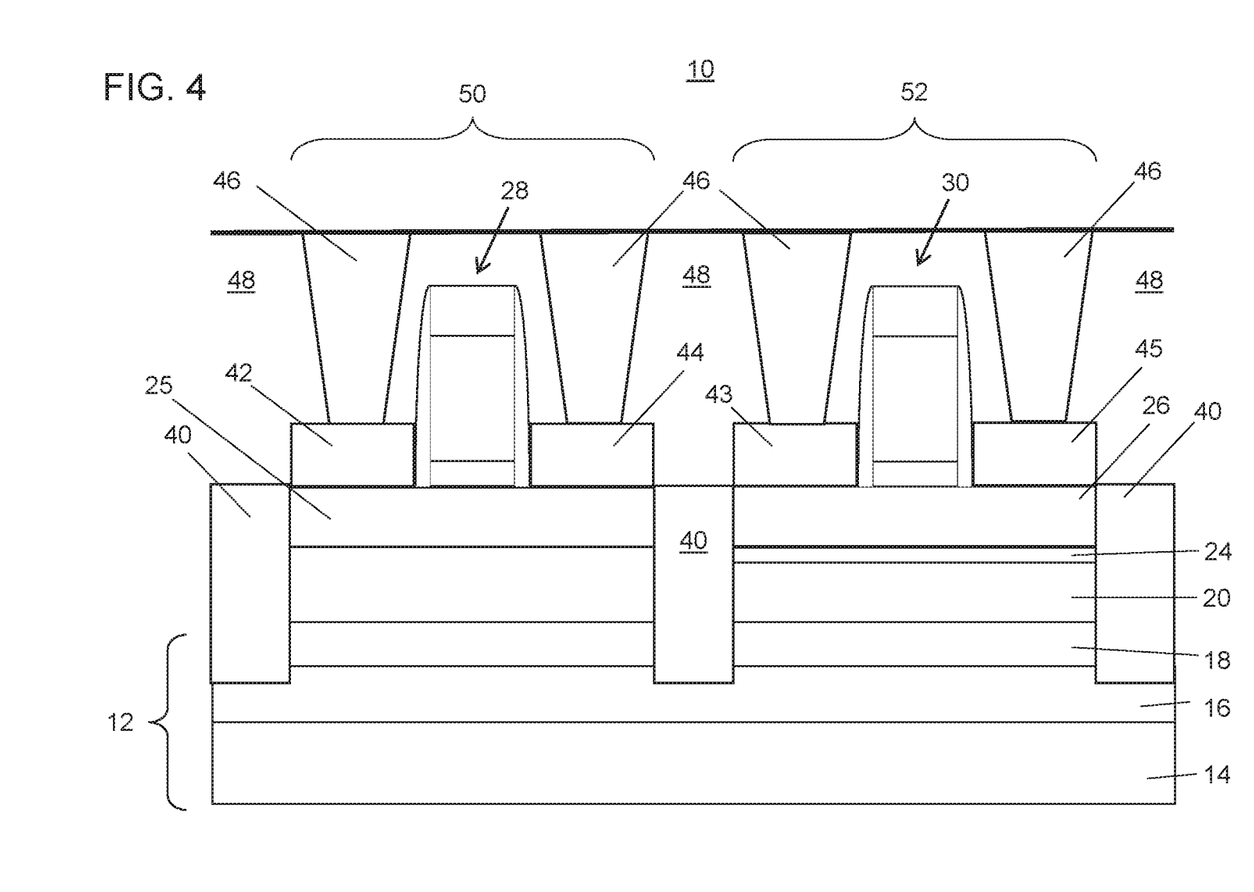
FIG. 4 is a cross-sectional view showing the device of FIG. 3 with contacts concurrently formed in the transistor region and the anti-fuse region in accordance with the present principles.

Referring to FIG. 4, source and drain regions 42, 44 are formed on the layers 25 and 26 respectively. A number of different sources may be used for the deposition of the semiconductor material that forms raised source/drain regions 42, 44. In some embodiments, in which the semiconductor material that forms the raised source/drain regions 42, 44 is composed of silicon, the silicon gas source for epitaxial deposition may be selected from the group consisting of hexachlorodisilane ($Si_2Cl_6$), tetrachlorosilane ($SiCl_4$), dichlorosilane ($Cl_2SiH_2$), trichlorosilane ($Cl_3SiH$), methylsilane (($CH_3$)$SiH_3$), dimethylsilane (($CH_3$)$_2SiH_2$), ethylsilane (($CH_3CH_2$)$SiH_3$), methyldisilane (($CH_3$)$Si_2H_5$), dimethyldisilane (($CH_3$)$_2Si_2H_4$), hexamethyldisilane (($CH_3$)$_6Si_2$) and combinations thereof. In some embodiments, in which the semiconductor material that forms the raised source/drain regions 42, 44 is composed of germanium, the germanium gas source for epitaxial deposition may be selected from the group consisting of germane ($GeH_4$), digermane ($Ge_2H_6$), halogermane, dichlorogermane, trichlorogermane, tetrachlorogermane and combinations thereof. In some embodiments, in which the semiconductor material that forms the raised source/drain region 42, 44 is composed of silicon germanium, the silicon sources for epitaxial deposition may be selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof, and the germanium gas sources may be selected from the group consisting of germane, digermane, halogermane, dichlorogermane, trichlorogermane, tetrachlorogermane and combinations thereof.

The raised source/drain regions 43, 45 may be formed during the same epitaxial growth method but may include defects from the underlying layer 26. The raised source/drain regions 42, 43, 44, 45 may be formed using a selective deposition process (e.g., epitaxy for semiconductor material) and are therefore self-aligned using the STIs 40 and gate structures 28, 30.

Following the formation of source/drain regions, a layer of dielectric material 48 is blanket deposited atop the entire substrate and planarized. The blanket dielectric may be selected from the group consisting of silicon-containing materials such as $SiO_2$, $Si_3N_4$, $SiO_xN_y$, SiC, SiCO, SiCOH, and SiCH compounds; the above-mentioned silicon-containing materials with some or all of the Si replaced by Ge; carbon-doped oxides; inorganic oxides; inorganic polymers; hybrid polymers; organic polymers such as polyamides or SiLK™; other carbon-containing materials; organo-inorganic materials such as spin-on glasses and silsesquioxane-based materials; and diamond-like carbon (DLC, also known as amorphous hydrogenated carbon, a-C:H). Additional choices for the blanket dielectric 48 may include: any of the aforementioned materials in porous form, or in a form that changes during processing to or from being porous and/or permeable to being non-porous and/or non-permeable.

The blanket dielectric 48 may be formed by various methods well known to those skilled in the art, including, but not limited to: spinning from solution, spraying from solution, chemical vapor deposition (CVD), plasma enhanced CVD (PECVD), sputter deposition, reactive sputter deposition, ion-beam deposition and evaporation.

The deposited dielectric 48 is then patterned and etched to forth via holes to the various source/drain and gate conductor regions of the device 10. Following via formation, interconnects or contacts 46 are formed by depositing a conductive metal into the via holes using, e.g., CVD. The contacts 46 may include any suitable conductive material, such as polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tungsten silicide, tungsten nitride, ruthenium oxide, cobalt silicide, nickel silicide), carbon nanotube, conductive carbon, graphene, or any suitable combination of these materials. The conductive material may further comprise dopants that are incorporated during or after deposition.

In accordance with the present principles, FETs 50 are formed on a same device as anti-fuses 52. The anti-fuses 52 include defective Si (or other materials) and can be turned on to make a connection between the source/drain regions 43, 45 through the defective layer 26. In one embodiment, the anti-fuse 52 is programmed using a field effect of the gate 30. When the gate is activated, the defective layer 26 is altered to provide a conductive path (short) between the source/drain regions 43, 45. In one embodiment, the defective layer 26 is configured to make a permanent conductive path. The permanent path is programmed after fabrication is complete using only the voltages available on-chip. For example, a supply voltage or threshold voltage for the FETs 50 may be employed to permanently program the anti-fuse 52. The threshold voltage is considered a low voltage for programming the fuse, and may be between about +/−0.5 volts to about +/−3 volts for a 2 nm gate dielectric.

The anti-fuse 52 works as follows. An electrical field across the gate dielectric 32 can break the gate dielectric when the electric field exceeds the breakdown electric field of the gate dielectric 32. Once breakdown occurs, the gate current increases significantly. If the gate dielectric 32 is not broken, the gate current is much smaller. To program an anti-fuse, the source and drain are grounded and a large voltage is applied to the gate 30, creating a large electric field across the gate dielectric 32 to break down the gate dielectric 32. Current can flow from the gate 30 to the defective silicon channel 26 and the source/drain 43/45. For example, the gate dielectric may include hafnium oxide with a thickness of 2 nm, a gate voltage of 3 volts can break down the gate dielectric in this case.

Figure 5:
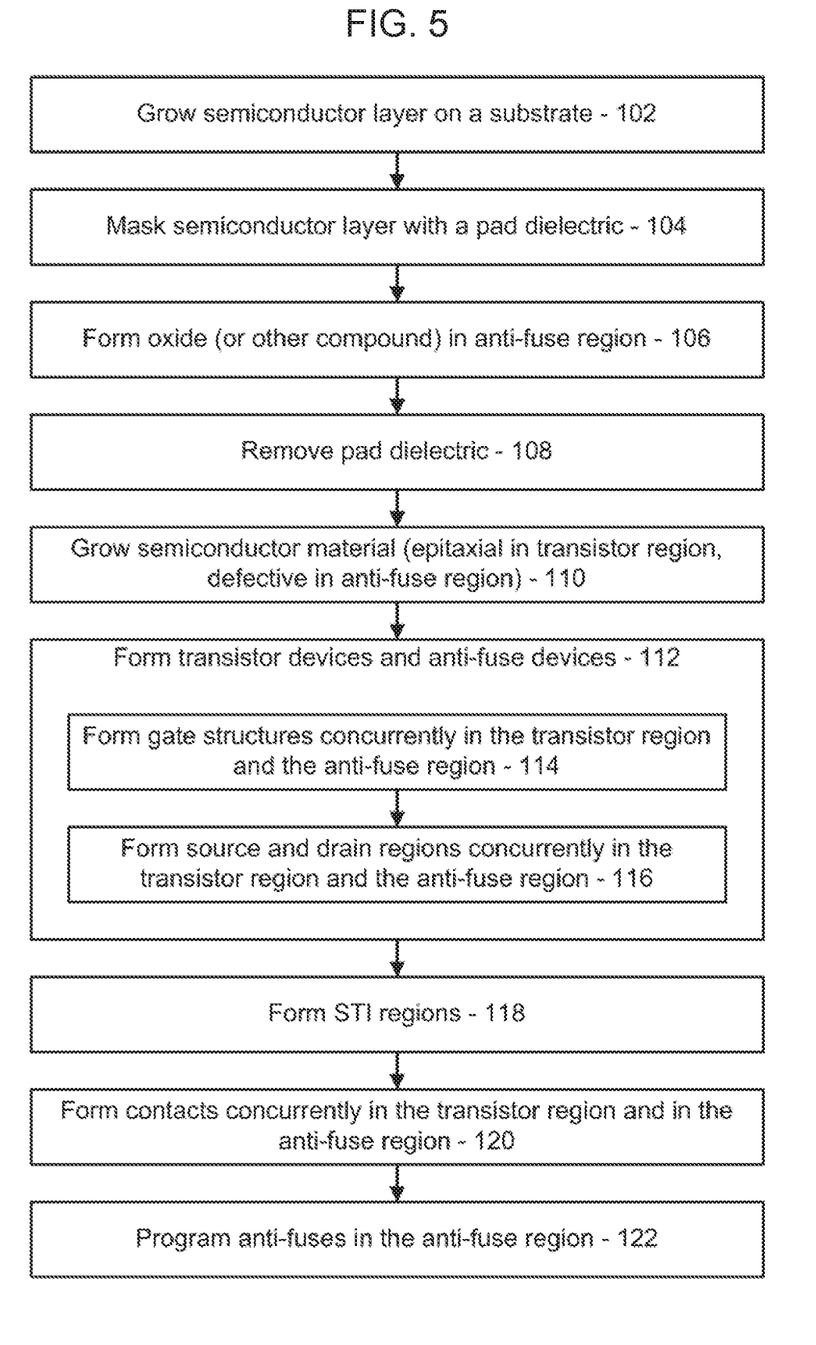
FIG. 5 is a block/flow diagram showing methods for co-integrating transistors and anti-fuses on a same chip in accordance with the present principles.

Referring to FIG. 5, methods for integrating transistors and anti-fuses on a same device are provided in accordance with illustrative embodiments. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 102, a semiconductor layer is epitaxially grown on a substrate. The substrate may take any form, e.g., ETSOI, SOI, bulk, etc. In block 104, a transistor region of the semiconductor layer is masked with a pad dielectric layer. The pad dielectric layer is patterned, e.g., using lithography or other process, to protect the transistor region from oxidation during subsequent processing. In block 106, an oxide (or other compound) is formed on an anti-fuse region of the semiconductor layer. While an oxide is preferred, other chemical reactions may be employed to create a defective semiconductor in subsequent steps. The oxide may be grown by exposing the semiconductor layer to oxygen-containing species in accordance with the pad dielectric. In block 108, the pad dielectric layer is removed, e.g., by selective etching.

In block 110, a semiconductor material is grown over the semiconductor layer to form a semiconductor layer, which may be strained, in the transistor region and a defective semiconductor layer in the anti-fuse region. The semiconductor material is grown using an epitaxial growth process. In block 112, transistor devices are formed in the transistor region and anti-fuse devices are formed in the anti-fuse region. In block 114, gate structures are concurrently formed in the transistor region and the anti-fuse region. The gate structures may include a gate dielectric, a gate conductor, a gate cap and spacers.

In block 116, source and drain regions are formed adjacent to the gate structures in the transistor region and the anti-fuse region. The source and drain regions may be epitaxially grown on the semiconductor material (e.g., strain semiconductor in the transistor region and defective semiconductor in the anti-fuse region). In one embodiment, the semiconductor layer includes SiGe and the semiconductor material includes strained Si in the transistor region and defective Si in the anti-fuse region. The defective semiconductor layer in the anti-fuse region is programmable by an applied field.

In block 118, shallow trench isolation (STI) regions are formed. The STI regions may be formed between the transistor region and the anti-fuse region. In block 120, an interlevel dielectric layer is formed, planarized and patterned. Contacts are concurrently formed in the transistor region and the anti-fuse region by depositing conductive material followed by a planarization process (e.g., CMP). In block 122, anti-fuses are programmed in the anti-fuse region by activating a gate of the gate structure in the anti-fuse region. This is performed after the device is completed. The anti-fuse may be employed to activate a redundant array or to short circuit a component(s) on the device.

Having described preferred embodiments for an anti-fuse with reduced programming voltage (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A semiconductor device having transistors and anti-fuses integrated thereon, comprising:
 a transistor region having a defect free monocrystalline semiconductor layer and a device channel for a transistor on top of an epitaxial semiconductor layer;
 an anti-fuse region including a defective semiconductor layer formed on an oxide of a portion of a surface of the epitaxial semiconductor layer over which a transistor is formed, the oxide having a thickness extending on top of the epitaxial semiconductor layer; and
 gate structures formed in the transistor region and in the anti-fuse region, wherein the defective semiconductor layer is programmable by an applied field on the gate structures in the anti-fuse region.

2. The device as recited in claim 1, further comprising contacts formed in the transistor region and the anti-fuse region.

3. The device as recited in claim 1, wherein the defective semiconductor layer includes Si and forms a conductive path by activating a gate of the gate structure in the anti-fuse region above a threshold voltage.

4. The device as recited in claim 1, wherein the semiconductor layer includes SiGe and a semiconductor material includes strained Si in the transistor region.

5. The device as recited in claim 1, further comprising:
 a shallow trench isolation region formed between the transistor region and the anti-fuse region.

6. The device as recited in claim 1, wherein the source and drain regions are formed on the semiconductor material in the transistor region and the defective semiconductor layer in the anti-fuse region.

7. The device as recited in claim 1, wherein the defective semiconductor layer's defects include at least one of dislocations, stacking faults, and grain boundaries.

8. The device as recite in claim 1, wherein a semiconductor material in the transistor region and the defective semiconductor layer are each concurrently formed from a common epitaxially grown layer.

9. The device as recited in claim 1, wherein a thickness of the defective semiconductor layer is between about 3 nanometers and about 20 nanometers.

10. The device as recited in claim 1, further including source and drain regions in the anti-fuse region including defects from the defective semiconductor layer.

11. The device as recited in claim 1, wherein a defect density of the defective semiconductor layer is between about $1 \times 10^6 / cm^2$ and about $1 \times 10^{12} / cm^2$.

12. A semiconductor device having transistors and anti-fuses integrated thereon, comprising:

a transistor region including a defect free monocrystalline strained semiconductor material formed over a semiconductor layer to form a device channel for a transistor;

an anti-fuse region including:

an oxidized surface of the semiconductor layer in the anti-fuse region forming an oxide layer having a thickness extending on top of the semiconductor layer in the anti-fuse region;

a defective semiconductor layer epitaxially grown on the oxidized surface in the anti-fuse region; and gate structures formed in the transistor region and in the anti-fuse region, wherein the defective semiconductor layer is programmable by an applied field on the gate structures in the anti-fuse region.

13. The device as recited in claim 12, wherein the strained semiconductor material in the transistor region and the defective semiconductor layer are each concurrently formed from a common epitaxially grown layer.

14. The device as recited in claim 12, wherein a thickness of the defective semiconductor layer is between about 3 nanometers and about 20 nanometers.

15. The device as recited in claim 12, wherein the defective semiconductor layer includes Si and forms a conductive path by activating a gate of the gate structure in the anti-fuse region above a threshold voltage.

16. The device as recited in claim 12, wherein the semiconductor layer includes SiGe and the strained semiconductor material includes strained Si in the transistor region.

17. The device as recited in claim 12, further comprising:
a shallow trench isolation region formed between the transistor region and the anti-fuse region.

18. The device as recited in claim 12, further including source and drain regions are formed on the strained semiconductor material in the transistor region and on the defective semiconductor layer in the anti-fuse region.

19. The device as recited in claim 12, further including source and drain regions in the anti-fuse region including defects from the epitaxially grown semiconductor layer.

20. A method for integrating transistors and anti-fuses on a device, comprising:

epitaxially growing a semiconductor layer on a substrate;

forming an oxide on an anti-fuse region of the semiconductor layer;

growing a semiconductor material over the semiconductor layer to form an epitaxial semiconductor layer in a transistor region and a defective semiconductor layer in the anti-fuse region; and forming transistor devices in the transistor region including the epitaxial semiconductor layer and anti-fuse devices in the anti-fuse region wherein the defective semiconductor layer is programmable by an applied field.

* * * * *